US012679208B2

(12) United States Patent　　　(10) Patent No.:　US 12,679,208 B2
Kim　　　　　　　　　　　　　　(45) Date of Patent:　　Jul. 14, 2026

(54) COCKPIT SYSTEM AND VEHICLE THEREFOR

(71) Applicant: HYUNDAI MOBIS CO., LTD., Seoul (KR)

(72) Inventor: Kyung Hoon Kim, Seongnam-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 0 days.

(21) Appl. No.: 18/764,012

(22) Filed: Jul. 3, 2024

(65) Prior Publication Data

US 2025/0214436 A1　　Jul. 3, 2025

(30) Foreign Application Priority Data

Dec. 28, 2023　(KR) ........................ 10-2023-0195049

(51) Int. Cl.
　　*B60K 35/29*　　　　　(2024.01)
　　*B60K 35/22*　　　　　(2024.01)
　　　　　　(Continued)

(52) U.S. Cl.
　　CPC .............. *B60K 35/29* (2024.01); *B60K 35/22* (2024.01); *B60K 35/26* (2024.01); *B60K 35/28* (2024.01);
　　　　　　(Continued)

(58) Field of Classification Search
　　CPC ........ B60K 35/29; B60K 35/22; B60K 35/26; B60K 35/28; B60K 2360/1434; B60K 2360/182; B60K 2360/21; B60K 2360/349; B60K 2360/741; G06F 3/011; G06F 3/02; G06F 3/165; G06F 3/04886;

G06V 20/593; G09G 5/10; G09G 2320/0626; G09G 2354/00; G09G 2360/144; G09G 2380/12; G09G 2380/10; H03K 17/96
See application file for complete search history.

(56) References Cited

U.S. PATENT DOCUMENTS 11,679,678 B2 *　6/2023　Seger, Jr. .............. G06F 3/0446
　　　　　　　　　　　　　　　　345/174
2018/0130449 A1　5/2018　Jeon et al.
　　　　　　(Continued)

FOREIGN PATENT DOCUMENTS

KR　　　20100074879 A　*　7/2010　............... G06F 3/14

OTHER PUBLICATIONS

Extended European Search Report Issued on Mar. 24, 2025, in Counterpart European Patent Application No. 24192213.7 (8 Pages in English).

*Primary Examiner* — Douglas Wilson
(74) *Attorney, Agent, or Firm* — NSIP Law

(57)　　　　　　ABSTRACT

A cockpit system and a vehicle thereof are provided. The cockpit includes: a front display disposed in front of a driver's seat and a passenger seat of the vehicle, the front display including display areas and a shy button included in at least one of the display areas; a camera to monitor the driver's seat or the passenger seat; and a controller that determines whether an occupant is in the driver's seat or the passenger seat, controls at least one of the display areas of the front display, makes the display area including the shy button indistinguishable from the other display areas in response to the shy button being deactivated, and activates the shy button, only when the occupant is detected in the passenger seat through the camera.

16 Claims, 7 Drawing Sheets

(51) Int. Cl.

| | |
|---|---|
| *B60K 35/26* | (2024.01) |
| *B60K 35/28* | (2024.01) |
| *G06F 3/01* | (2006.01) |
| *G06F 3/02* | (2006.01) |
| *G06F 3/04886* | (2022.01) |
| *G06F 3/16* | (2006.01) |
| *G06V 20/59* | (2022.01) |
| *G09G 5/10* | (2006.01) |
| *H03K 17/96* | (2006.01) |

(52) U.S. Cl.

CPC ................ *G06F 3/011* (2013.01); *G06F 3/02* (2013.01); *G06F 3/165* (2013.01); *G06V 20/593* (2022.01); *G09G 5/10* (2013.01); *B60K 2360/1434* (2024.01); *B60K 2360/182* (2024.01); *B60K 2360/21* (2024.01); *B60K 2360/349* (2024.01); *B60K 2360/741* (2024.01); *G06F 3/04886* (2013.01); *G09G 2320/0626* (2013.01); *G09G 2354/00* (2013.01); *G09G 2360/144* (2013.01); *G09G 2380/10* (2013.01); *G09G 2380/12* (2013.01); *H03K 17/96* (2013.01)

(56) References Cited

U.S. PATENT DOCUMENTS

| | | | |
|---|---|---|---|
| 2020/0159481 A1 | 5/2020 | You et al. | |
| 2020/0167116 A1* | 5/2020 | Manabe | B60K 35/656 |
| 2020/0249899 A1 | 8/2020 | Higuchi et al. | |
| 2021/0354559 A1 | 11/2021 | Kim et al. | |
| 2023/0094520 A1 | 3/2023 | Kim et al. | |
| 2024/0386854 A1* | 11/2024 | Chen | G06F 3/04886 |
| 2025/0110546 A1* | 4/2025 | Behzadi | G06F 3/04847 |

* cited by examiner

COCKPIT SYSTEM AND VEHICLE THEREFOR

CROSS-REFERENCE TO RELATED APPLICATION(S)

This application is based on and claims priority under 35 U.S.C. § 119 to Korean Patent Application No. 10-2023-0195049, filed on Dec. 28, 2023, in the Korean Intellectual Property Office, the entire disclosure of which is incorporated herein by reference for all purposes.

BACKGROUND

1. Field

The embodiments relate to a display in a vehicle (e.g., an automobile, a mobile device, a mobility device, etc.) or an uncrewed aerial vehicle (UAV), and more particularly, to a cockpit system including a display.

2. Description of the Related Art

As vehicles have become digital in recent years, many controllers are mounted in a vehicle, and various communication functions between the controllers allow the vehicle to be located remotely and discover a nearby charging station via the Internet or a smartphone. In addition, all information about the current state of the vehicle is checked in real time, such as battery charging or pre-conditioning, with a simple touch on a button. Further, an intelligent driving assistance system acquires information about road driving to build a driving environment more convenient for the driver.

In this regard, a cluster is used, which provides the basic functions of the vehicle, such as a driving speed, a mileage, an odometer, and an engine RPM dashboard. For example, the cluster provides charging infrastructure network information, a distance to empty (DTE), a current battery state, information output, and other accurate and convenient vehicle information required for a driving environment.

In particular, vehicles have recently used digital clustering of various digital cockpits to effectively represent vehicle information. Therefore, there is a need to develop a technique for handling these digital cockpits in an integrated manner.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

To address the above-described problems, embodiments of the disclosure provide a shy button for a passenger, which is activated or deactivated depending on whether a passenger is present or not.

Embodiments of the disclosure provide a shy button which is automatically activated by detecting a user's approach.

Embodiments of the disclosure provide a see-through panel which transmits light from a lower area of a front display to provide information to a driver and a passenger.

The objects to be achieved by the disclosure are not limited to the above-described technical objects, and those skilled in the art will clearly understand other unmentioned technical objects from the following description.

In a general aspect of the disclosure, a cockpit system for a vehicle, the cockpit system includes: a front display disposed in front of a driver's seat and a passenger seat of the vehicle, the front display including display areas and a shy button included in at least one of the display areas; a camera to monitor the driver's seat or the passenger seat; and a controller configured to: determine whether an occupant is in the driver's seat or the passenger seat; control at least one of the display areas of the front display; make the display area including the shy button indistinguishable from the other display areas in response to the shy button being deactivated; and activate the shy button, only when the occupant is detected in the passenger seat through the camera.

The shy button may include at least one button configured to be touchable, and the shy button may be configured in the form of an engraving having a permanent shape.

The front display may further include a first in-vehicle infotainment (IVI) display and a second IVI display, and the shy button may include: a button configured to adjust a screen brightness of the second IVI display; and a button configured to adjust a volume of multimedia played on the second IVI display.

The controller may be further configured to automatically deactivate the shy button in response to detection of a video being played on the front display.

The cockpit system may further include an approach detection sensor, wherein the controller may be further configured to deactivate the shy button in response to detection by the approach detection sensor of a user approaching the shy button.

The cockpit system may further include a see-through panel configured to, when a low mode is applied, provide information to the driver and the passenger by transmitting light from a lower area of the front display, after the front display is moved downward, wherein the front display may be moved downward in response to the low mode being applied, and wherein a button located in a lower part of the shy button may be covered by the see-through panel in response to the low mode being applied.

In the low mode, at least one of exposed buttons in the shy button may be configured to further implement a function of the button located in the lower part.

The see-through panel may be configured to implement a function of the button located in the lower part in response to a shy button area being touched.

The cockpit system may further include an illuminance sensor, wherein the front display may measure an indoor brightness through the illuminance sensor and adjust a brightness of the display areas according to the measured brightness.

In another general aspect of the disclosure, a vehicle includes a cockpit system including: a front display disposed in front of a driver's seat and a passenger seat of the vehicle, the front display including display areas and a shy button included in at least one of the display areas; a camera configured to monitor the driver's seat or the passenger seat; and a controller configured to: determine whether an occupant is in the driver's seat or the passenger seat; control at least one of the display areas of the front display; make the display area including the shy button indistinguishable from the other display areas in response to the shy button being deactivated; and activate the shy button, only when the occupant is detected in the passenger seat through the camera.

The shy button may include at least one touch-sensitive button, and the shy button may include an engraved outer surface.

The front display may further include a first in-vehicle infotainment (IVI) display and a second IVI display, and the shy button may include: a button to adjust a screen brightness of the second IVI display; and a button to adjust a volume of multimedia played on the second IVI display.

The controller may be further configured to automatically deactivate the shy button in response to a detection of a video being played on the front display.

The controller may be further configured to deactivate the shy button in response to detection by the camera of a user approaching the shy button.

The vehicle may further include an approach detection sensor, wherein the controller may be further configured to deactivate the shy button in response to detection by the approach detection sensor of a user approaching the shy button.

The vehicle may further include a see-through panel configured to, when a low mode is applied, provide information to the driver and the passenger by transmitting light from a lower area of the front display, after the front display is moved downward, wherein the front display may be moved downward in response to the low mode being applied, and wherein a button located in a lower part of the shy button may be covered by the see-through panel in response to the low mode being applied.

In the low mode, at least one of exposed buttons in the shy button may be configured to further implement a function of the button located in the lower part.

The see-through panel may be configured to implement a function of the button located in the lower part in response to a shy button area being touched.

In yet another general aspect of the disclosure, a cockpit system for a vehicle includes: a front display disposed in front of a driver's seat and a passenger seat of the vehicle, the front display including display areas and a shy button included in at least one of the display areas; a camera to monitor the driver's seat or the passenger seat; and a controller in communication with the camera and configured to: determine whether an occupant is in the driver's seat or the passenger seat based on one or more images captured by the camera; and control the front display to display information in at least one of the display areas of the front display, make the display area including the shy button indistinguishable from the other display areas in response to the shy button being deactivated, and activate the shy button in response to the determination that the occupant is in the passenger seat.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 2 is a diagram illustrating states of a front display in the presence and absence of a passenger according to an embodiment of the disclosure;

DETAILED DESCRIPTION

Figure 1:
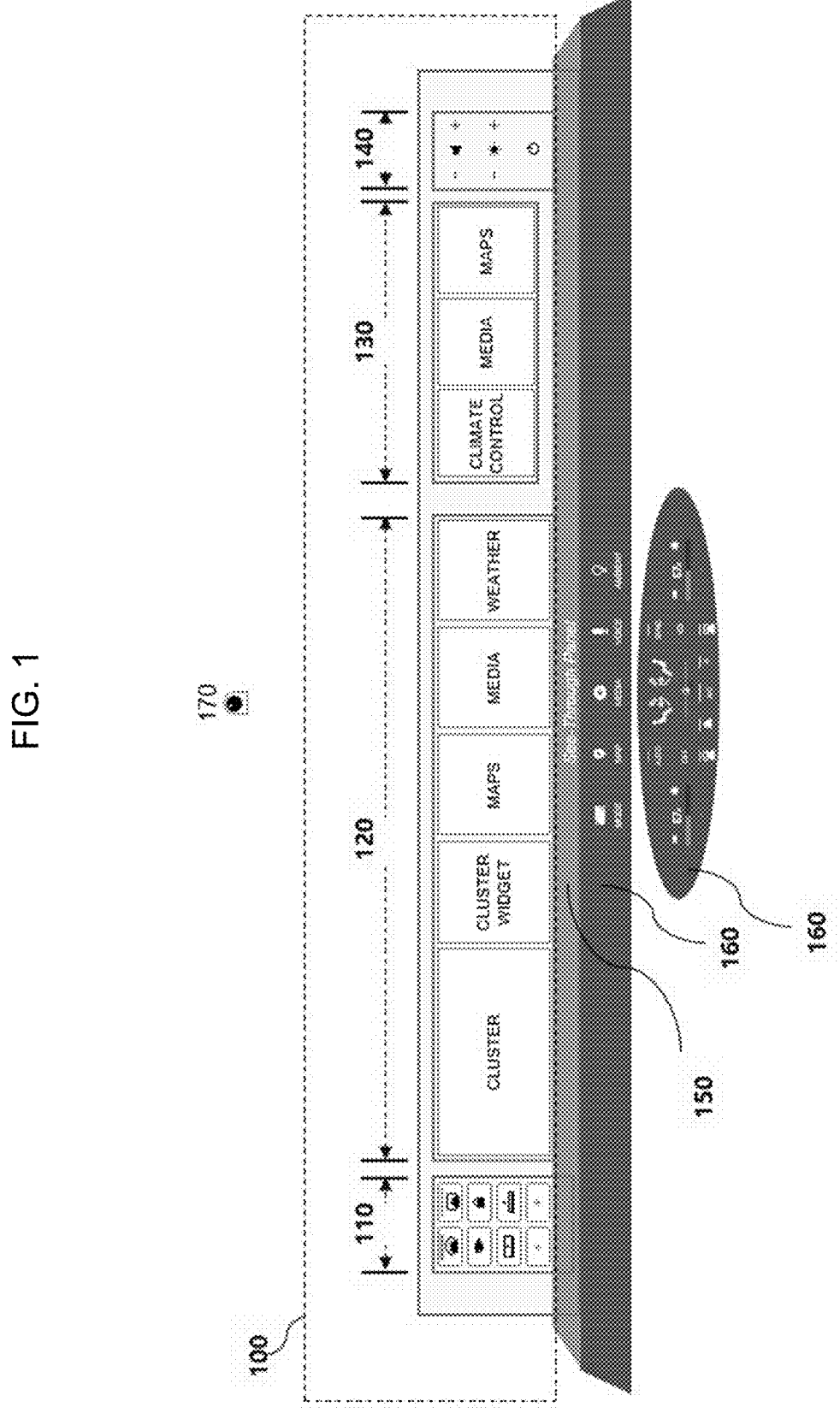
FIG. 1 is a diagram illustrating an exemplary configuration of a cockpit system according to an embodiment of the disclosure.

Embodiments of the disclosure will be described in detail with reference to the attached drawings, so that those skilled in the art may easily implement the disclosure. However, the disclosure may be implemented in many different forms and is not limited to the embodiments described herein. In order to clearly describe the disclosure in the drawings, parts not related to the description are omitted, and similar reference numerals are assigned to similar components throughout the specification.

Throughout the specification, when a part is said to "include" a certain element, this means that it may further include other elements rather than excluding them, unless otherwise specified.

FIG. 1 is a diagram illustrating an exemplary configuration of a cockpit system according to an embodiment of the disclosure.

It is assumed that a front display 100 illustrated in FIG. 1 is disposed in front of a driver's seat and a passenger seat in a vehicle (e.g., an automobile, a mobile device, a mobility device, etc.). In other words, the front display 100 is preferably disposed across the front of the passenger seat as well as the front of the driver's seat in the mobile device.

Additionally, the front display 100 according to the embodiment illustrated in FIG. 1 may include a plurality of display areas 110, 120, 130, and 140. While the plurality of display areas 110, 120, 130, and 140 are shown in FIG. 1 as specifically including a driver-operated display 110, a first in-vehicle infotainment (IVI) display 120, a second IVI display 130, and a shy button 140, they may be configured in various other forms.

The driver-operated display 110 may be a display providing a function (e.g., a driving control-related function) that the driver may use, when needed.

The first IVI display 120 may play a cluster related to the driver's driving, a cluster widget, a map, media, and a weather-related application, and reset an area in which an application is displayed according to the driver's (or passenger's) operation or condition settings.

The second IVI display 130 may display applications that may be controlled by the passenger, such as weather-related control, media, and a map.

The shy button 140 generally refers to a button configured to be recognized within the user's field of view, only when needed. In the example of FIG. 1, the shy button 140 is shown as a shy button providing a function (e.g., a function related to music playback) that a passenger in the passenger seat may use, when needed, by way of example.

However, the configuration of the display described above is an example, and the corresponding areas may be integrally displayed according to the driver/passenger's operation or condition settings. For example, a single integrated image may be displayed on the first IVI display 120 and the second IVI display 130.

In an embodiment of the disclosure, it is proposed to support a low mode to secure the driver's forward vision among display modes. During a low-mode operation, the front display 100 described above may be moved downward by a controller (not shown).

In an embodiment of the disclosure, it is further proposed to include a see-through panel 150 as illustrated in FIG. 1. As described above, the front display 100 may be configured such that when the front display 100 is moved downward by applying the low mode, light from a lower area of the front display 100 provides information to the driver and the passenger through the see-through panel 150.

It is assumed that the information provided through the see-through panel 150 corresponds to a screen displayed through each of the driver-operated display 110, the first IVI display 120, the second IVI display 130, and the shy button 140. However, the information provided through the see-through panel 150 is preferably simplified information, compared to information displayed on an upper part of the front display 100. "Simplified information" may refer to information that may be implemented at a low resolution, in a small amount, or in a combination of both, compared to information displayed in the upper part of the front display 100.

As illustrated in FIG. 1, the cockpit system according to an embodiment of the disclosure may further include an operating system 160. The operating system 160 may be implemented in a projection manner.

As illustrated in FIG. 1, the cockpit system according to an embodiment of the disclosure may include a camera 170. The camera 170 may be disposed at a position to enable monitoring of the driver's seat and the passenger seat. As long as it is capable of monitoring, any type of camera may be used.

Figure 2:
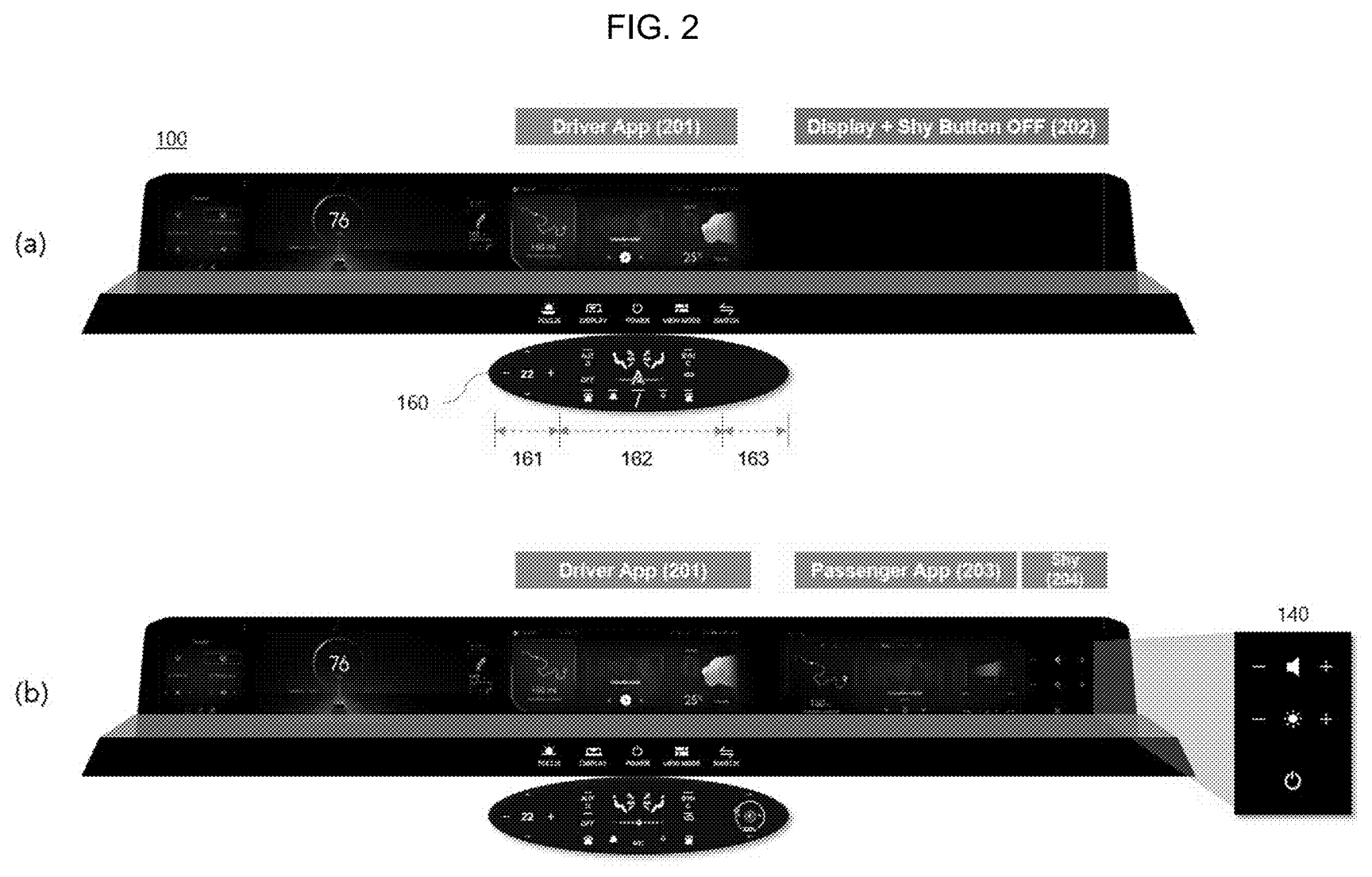

FIG. 2 is a diagram illustrating states of a front display in the presence and absence of a passenger according to an embodiment of the disclosure. FIG. 2(*a*) illustrates the front display in the absence of a passenger, and FIG. 2(*b*) illustrates the front display in the presence of a passenger.

In the embodiment illustrated in FIG. 2, the front display 100 and the operating system 160 are illustrated. The operating system 160 is shown as separated into a driver operating system 161, a heating, ventilation, and air conditioning (HVAC) operator 162, and a passenger operating system 163.

The cockpit system according to an embodiment of the disclosure may use a camera to determine whether a passenger is present in the passenger seat. When it is determined that no passenger is present, the second IVI display and the shy button may be deactivated. At this time, the operating system for a passenger 163 of the operating system may also be deactivated (FIG. 2(*a*)). When it is determined that a passenger is present, the second IVI display and the shy button 140 may be activated. At this time, the operating system for a passenger 163 of the operating system may also be activated (FIG. 2(*b*)).

The front display 100 according to an embodiment of the disclosure may implement a dead front effect which, when at least one of the plurality of display areas is deactivated, makes the deactivated display area indistinguishable from a part other than the deactivated display area.

It may be also configured that when the shy button is deactivated, the area of the shy button and an area other than the shy button are indistinguishable.

In the embodiment illustrated in FIG. 2(*a*), the second IVI display and the shy button are deactivated (202). The driver-operated display and the first IVI display are activated, and their edges may be subject to a gradation effect to provide a more natural dead front effect. The first IVI display may be displaying a driver app 201.

In the embodiment illustrated in FIG. 2(*b*), the second IVI display 203 and the shy button 140 are activated (204). The second IVI display may be displaying a passenger app 203, and the shy button 140 may also be activated (204) to allow the passenger to adjust the brightness and volume of the second IVI display. The shy button will be described in more detail with reference to the following drawings.

Figure 3:
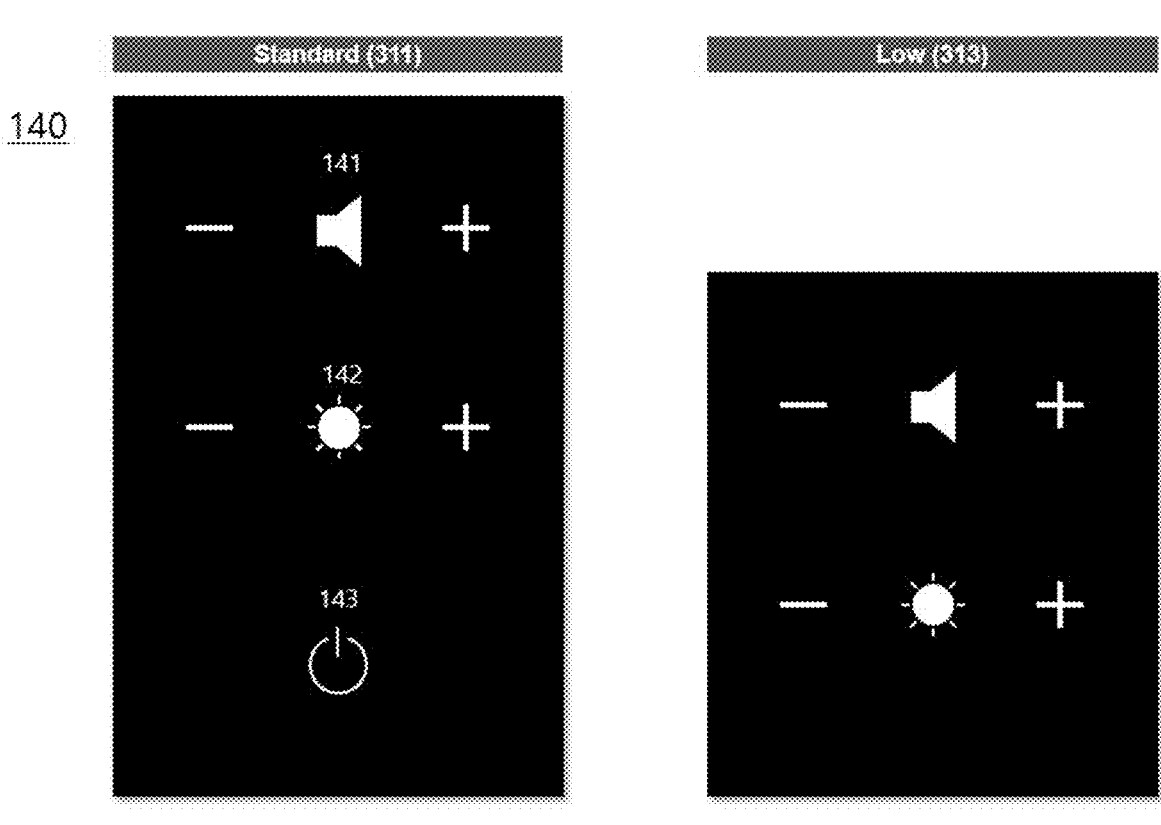
FIG. 3 is a diagram illustrating an exemplary configuration of a shy button according to an embodiment of the disclosure.

FIG. 3 is a diagram illustrating an exemplary configuration of a shy button according to an embodiment of the disclosure. In the embodiment illustrated in FIG. 3, the configuration of the shy button in a standard mode 311 and an exposed portion of the shy button in a low mode 313 are illustrated.

The shy button according to an embodiment of the disclosure may include at least one button configured to be touchable, such as in the standard mode 311 in FIG. 3. In FIG. 3, a button for adjusting a volume, a button for adjusting a screen brightness, and a power button are illustrated, by way of example. However, this is only exemplary, and the shy button may include various buttons.

In this embodiment, + and − volume buttons 141 may be buttons for adjusting the volume of a speaker directed toward the passenger seat or the volume of multimedia displayed on the second IVI display. + and − buttons 142 for adjusting a screen brightness may be buttons for adjusting the brightness of a screen on the second IVI display or the shy button. A power button 143 may be a button that controls to activate or deactivate the shy button.

Each button may be configured in the form of an engraving, so that the shape of the button is permanent. The shape of the button may be formed by a method such as laser engraving, and no other display elements may be added. Manufacturing the buttons in an engraving method has the advantage of lowering production unit cost and simplifying a manufacturing process. That is, the shy button(s) may have an engraved outer surface.

In the low mode 313, the front display is moved downward, and thus the shy button is also moved downward so that the bottom of the shy button is covered by the see-through panel. In the embodiment of FIG. 3, the power button is covered by the downward movement in the low mode 313, and the remaining uncovered portion is shown.

In this case, the function of the power button covered by the see-through panel may be taken over by another uncovered button. This will be described in more detail with reference to FIG. 6.

Figure 4:
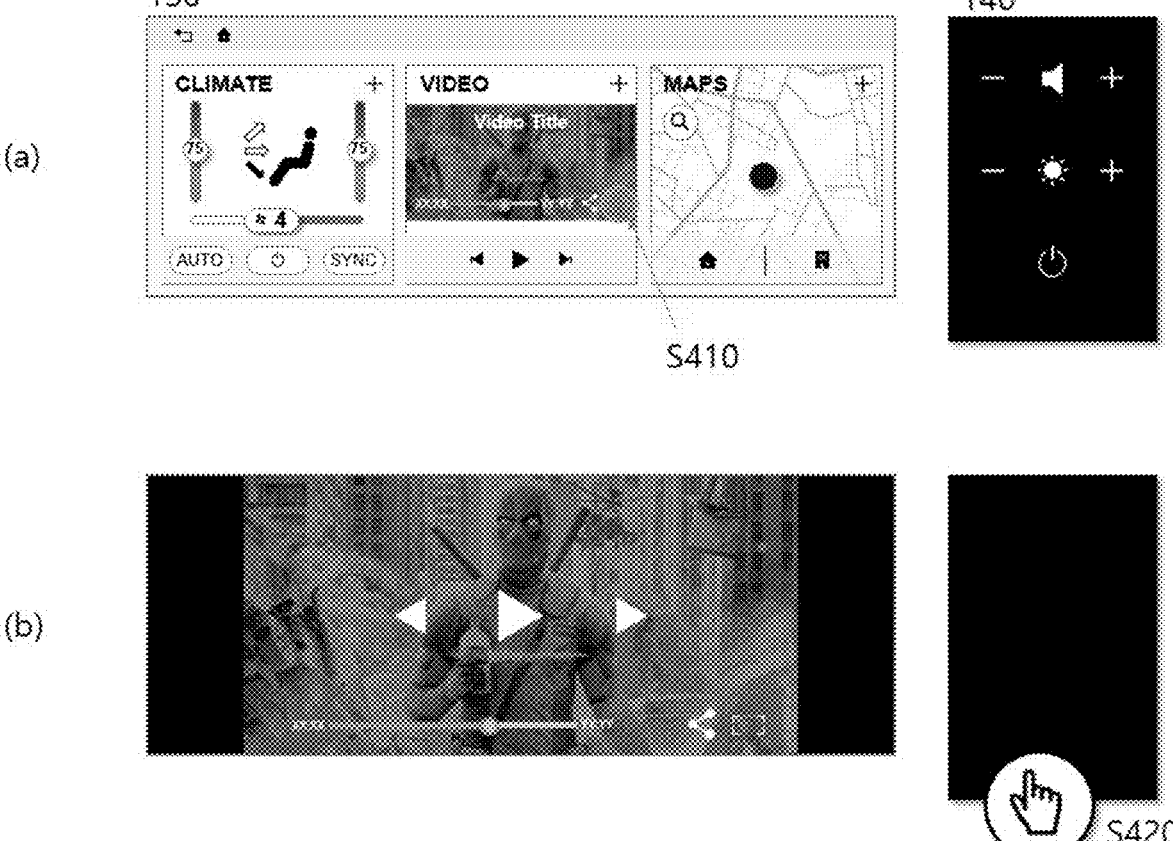
FIG. 4 is a diagram illustrating exemplary use of a second in-vehicle infotainment (IVI) display and a shy button according to an embodiment of the disclosure.

FIG. 4 is a diagram illustrating exemplary use of the second IVI display 130 and the shy button 140 according to an embodiment of the disclosure. FIG. 4(*a*) is a diagram illustrating a state in which the shy button is activated, and FIG. 4(*b*) is a diagram illustrating a state in which the shy button is deactivated. FIG. 4 is based on the assumption that a passenger is on board.

First, the second IVI display may display a passenger app, as in the embodiment illustrated in FIG. 4(*a*). Although FIG. 4(*a*) illustrates air conditioning system control, a multimedia app, and a map app, this is only exemplary, and various passenger apps may be configured. The shy button 140 may be activated.

Next, when the passenger plays a video on the second IVI display and selects to play it in a full screen mode (S410), the video may be played in full screen, as in the embodiment illustrated in FIG. 4(*b*). Herein, the shy button 140 may be automatically deactivated so as not to interfere with content viewing (FIG. 4(b)). While FIG. 4 illustrates an embodiment in which the shy button is deactivated during play of a video in full screen on the second IVI display, the shy button may be automatically deactivated when a video is played in full screen on the first or second IVI display, or even when a video is played in a portion of the front display.

Finally, to reactivate the deactivated shy button 140, upon detection of the passenger's hand approaching the shy button (S420), the shy button may be activated. The approach may be detected in various manners such as monitoring with a camera, using an infrared sensor, or using an approach detection sensor.

Figure 5:
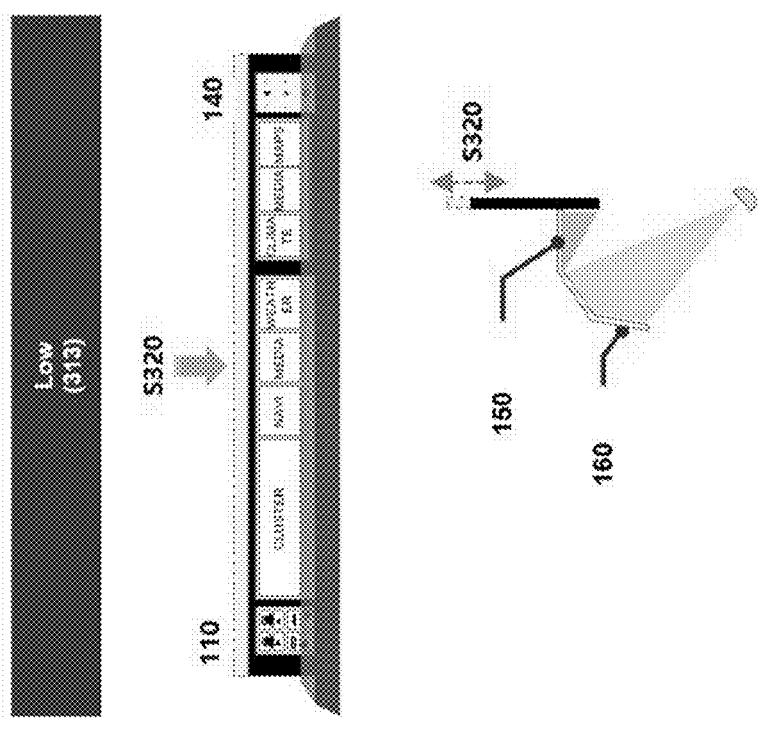
FIG. 5 is a diagram illustrating control of a front display according to an embodiment of the disclosure.
Figure 5:
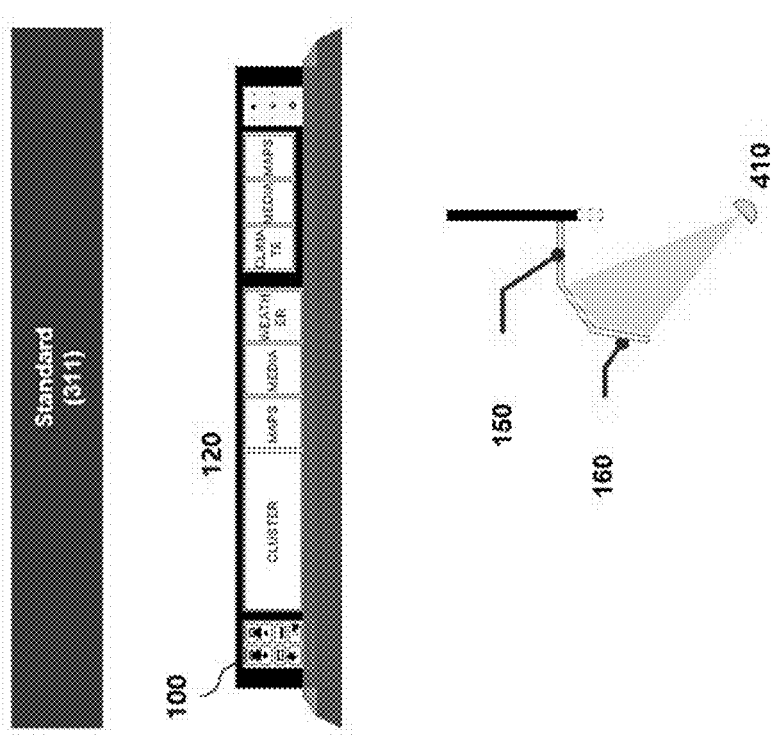

FIG. 5 is a diagram illustrating control of a front display according to an embodiment of the disclosure.

First, in the embodiment illustrated in FIG. 5, a display position is preferably set to a height at which the bottom line of a display active area of the first IVI display on the front display 100 is not covered by the see-through panel 150 in the standard mode 311.

Next, in the embodiment illustrated in FIG. 5, the low mode 313 is applied based on a low signal, and the front display may be moved downward to secure a forward vision (S320). In this case, it may be configured to provide simplified information by light emitted from the bottom of the display through the see-through panel 150, as described above.

In an embodiment of the disclosure, in the low mode 313, there is an area in a lower part of the shy button 140, which is covered due to the downward movement of the display, and in view of the nature of the shy button 140, it may not be efficient to use light from the bottom of the shy button 140 to provide information through the see-through panel 150. Accordingly, the shy button 140 may be configured such that the position of an existing shy button is maintained in an area that is not covered in the low mode 313, unlike the IV displays 120 and 130.

FIG. 5 illustrates an embodiment in which the operating system 160 is implemented in a projection manner using an internal projector 410. To implement a display-type operating system 160, a light-emitting display such as a light emitting diode (LED) display may be used. However, there are many curves/curved surfaces in the interior space of the mobile device, specifically a vehicle, and the light-emitting display is difficult to implement in consideration of the interior characteristics.

Therefore, in an embodiment of the disclosure, the operating system 160 may be configured in a projection manner using the internal projector 410 at the front of the mobile device. As illustrated in FIG. 5, the operating system 160 may be advantageously implemented freely even in a space with various curves/curved surfaces.

Figure 6:
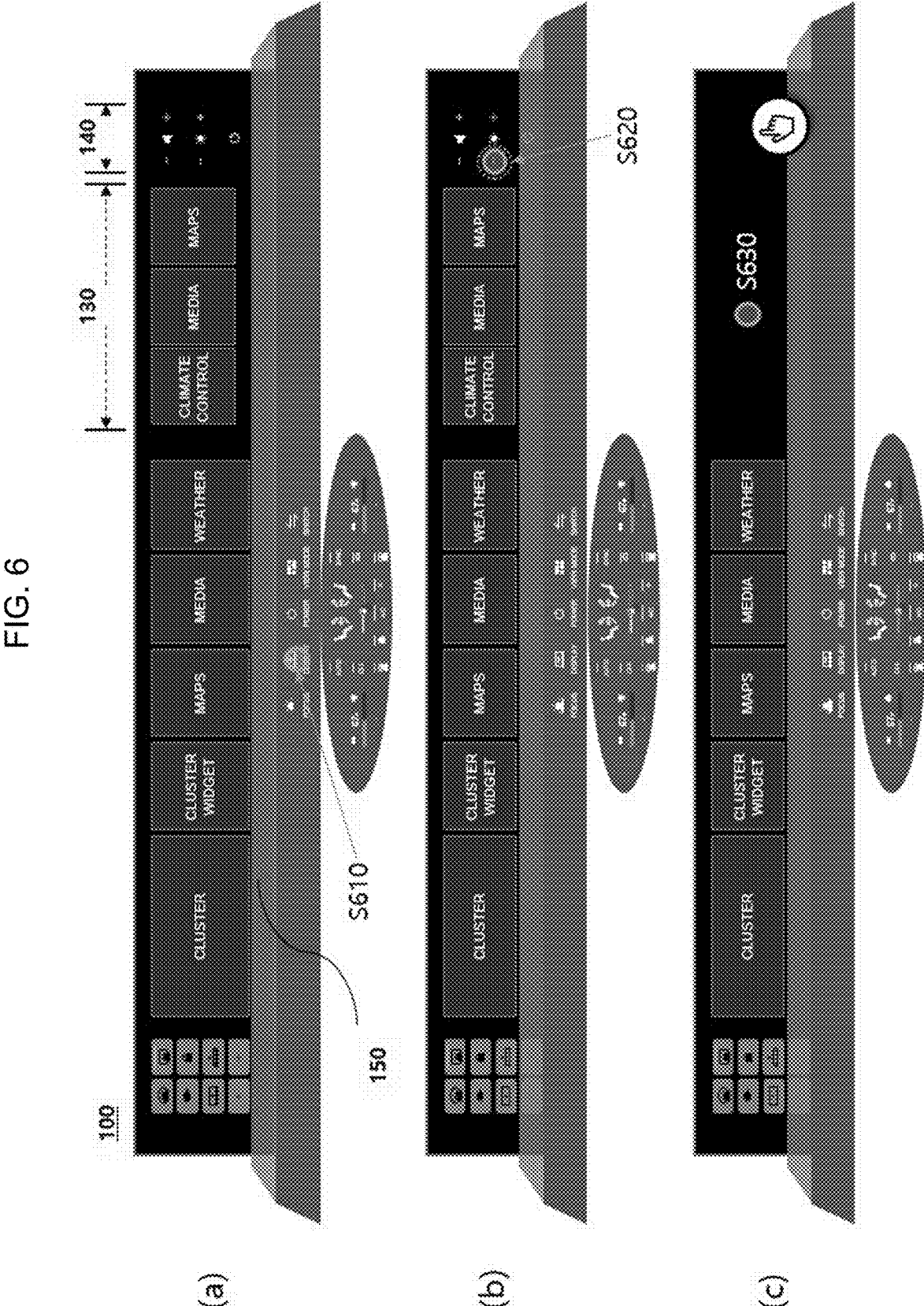
FIG. 6 is a diagram illustrating a method of operating a shy button in a low mode according to an embodiment of the disclosure.

FIG. 6 is a diagram illustrating a method of operating a shy button in a low mode according to an embodiment of the disclosure. FIG. 6(a) illustrates the position of the front display in the standard mode, and FIG. 6(b) illustrates the position of the front display and a method of operating the front display in the low mode. FIG. 6(c) illustrates the second IVI display and the shy button which are deactivated.

First, as illustrated in FIG. 6(a), the front display may be located at a height at which all buttons are visible, as described above regarding the standard mode. Then, when the user inputs a low mode signal (S610), the front display is moved downward so that its bottom is covered by the see-through panel 150.

FIG. 6(b) illustrates the front display which has been moved downward so that its bottom is covered by the see-through panel.

The second IVI display 130 may have a screen which is scaled down to fit the size of an uncovered portion in the low mode, or display rearranged information.

As described above, there is also an area in the lower part of the shy button 140, which is covered due to the downward movement of the display, and in view of the nature of the shy button 140, it may not be efficient to use light from the bottom of the shy button 140 to provide information through the see-through panel 150. In the case of the shy button 140, the existing position of the shy button may be maintained in an area that is not covered in the low mode, unlike the IV displays 120 and 130.

FIG. 6(b) illustrates an embodiment in which the power button is covered by the see-through panel 150. In this case, at least one of uncovered buttons may be configured to further implement the function of the covered button. For example, the function of the power button may be executed by a long touch on the – button for adjusting a screen brightness in the shy button (S620). This is only exemplary, and it may be configured to execute the function of the power button by a touch on a center button of the shy button or by gradually decreasing the brightness and then applying one last touch.

When the see-through panel includes a touch input function, light from the power button may be transmitted through the see-through panel to provide information to the driver and the passenger, and the function of the power button may be implemented by touching a light-transmitted position, that is, a shy button area.

In the embodiment illustrated in FIG. 6(c), the second IVI display and the shy button are shown as deactivated in the low mode. In this case, when the passenger touches the screen (S630), when the passenger is detected as approaching the screen using an approach detection sensor, or when the passenger is detected as attempting to use the screen, using a camera, the screen may be automatically activated, thereby increasing use convenience.

Figure 7:
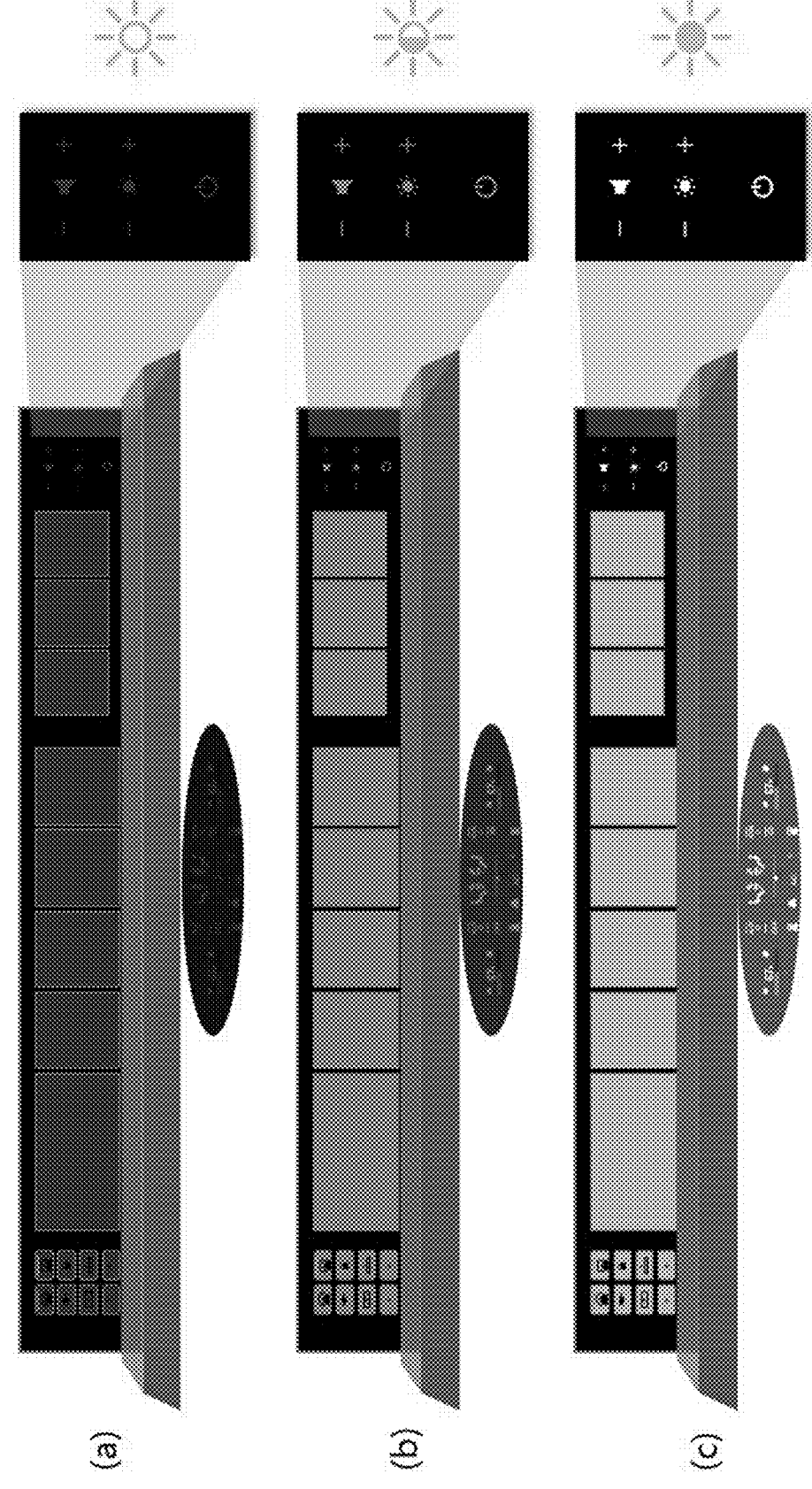
FIG. 7 is a diagram illustrating changes of a shy button based on indoor illuminances according to an embodiment of the disclosure.

FIG. 7 is a diagram illustrating changes of a shy button based on indoor illuminances according to an embodiment of the disclosure. In the embodiment of FIG. 7, the screen brightness of the front display at each illuminance is illustrated. The cockpit system according to an embodiment of the disclosure may further include an illuminance sensor.

FIG. 7(a) illustrates the front display with a lowest brightness. The brightness of the shy buttons and the operating system as well as the brightness of a display screen may be lowered according to an indoor illuminance.

FIG. 7(b) illustrates the front display with an intermediate brightness. FIG. 7(c) illustrates the front display with a highest brightness. While only three levels are illustrated in FIG. 7, the brightness of the screen may be continuously changed according to an indoor illuminance detected by the illuminance sensor. Obviously, the brightness of the screen may be intentionally adjusted by each operating button.

According to the above-described embodiments of the disclosure, a method of changing a cockpit layout according to a display mode and a cockpit system using the same may be efficiently configured.

Convenience may be increased and an aesthetic effect may be achieved by providing a shy button for a passenger, which may be activated or not depending on whether a passenger is present or not.

Use convenience may be increased by providing a shy button which is automatically deactivated during video play and automatically activated when a user approaches it.

As described above, a detailed description of preferred embodiments of the disclosure has been given to enable those skilled in the art to implement and practice the disclosure. While the above description has been made with reference to the preferred embodiments of the disclosure, it will be understood by those skilled in the art that various modifications and changes may be made to the disclosure without departing from the scope of the disclosure. For example, those skilled in the art may use the configurations described in the above-described embodiments in combination with each other.

Accordingly, the embodiments as set forth herein are not intended to limit the disclosure, but rather to give the broadest possible scope consistent with the principles and novel features disclosed herein.

What is claimed is:

1. A cockpit system for a vehicle, the cockpit system comprising:
  a front display disposed in front of a driver's seat and a passenger seat of the vehicle, the front display including display areas and a shy button included in at least one of the display areas;
  a camera to monitor the driver's seat or the passenger seat;
  an approach detection sensor; and
  a controller configured to:
    determine whether an occupant is in the driver's seat or the passenger seat;
    control at least one of the display areas of the front display;
    activate the shy button, only when the occupant is detected in the passenger seat through the camera;
    deactivate the shy button when the occupant is not detected in the passenger seat and make the display area including the shy button indistinguishable from the other display areas of the front display; and
    deactivate the shy button in response to detection by the approach detection sensor of a user approaching the shy button.

2. The cockpit system of claim 1, wherein the shy button includes at least one button configured to be touchable, and wherein the shy button is configured in the form of an engraving having a permanent shape.

3. The cockpit system of claim 1,
  wherein the front display further includes a first in-vehicle infotainment (IVI) display and a second IVI display, and
  wherein the shy button includes:
    a first button configured to adjust a screen brightness of the second IVI display; and
    a second button configured to adjust a volume of multimedia played on the second IVI display.

4. The cockpit system of claim 1, wherein the controller is further configured to automatically deactivate the shy button in response to detection of a video being played on the front display.

5. The cockpit system of claim 1, further comprising:
  an illuminance sensor,
  wherein the front display measures an indoor brightness through the illuminance sensor and adjust a brightness of the display areas according to the measured brightness.

6. A cockpit system for a vehicle, the cockpit system comprising:
  a front display disposed in front of a driver's seat and a passenger seat of the vehicle, the front display including display areas and a shy button included in at least one of the display areas;
  a camera to monitor the driver's seat or the passenger seat;

a see-through panel configured to, when a low mode is applied, provide information to the driver and the passenger by transmitting light from a lower area of the front display, after the front display is moved downward; and
  a controller configured to:
    determine whether an occupant is in the driver's seat or the passenger seat;
    control at least one of the display areas of the front display;
    activate the shy button, only when the occupant is detected in the passenger seat through the camera; and
    deactivate the shy button when the occupant is not detected in the passenger seat and make the display area including the shy button indistinguishable from the other display areas of the front display,
  wherein the front display is moved downward in response to the low mode being applied, and
  wherein a button located in a lower part of the shy button is covered by the see-through panel in response to the low mode being applied.

7. The cockpit system of claim 6, wherein in the low mode, at least one of exposed buttons in the shy button is configured to further implement a function of the button located in the lower part.

8. The cockpit system of claim 6, wherein the see-through panel is configured to implement a function of the button located in the lower part in response to a shy button area being touched.

9. A vehicle comprising:
  a cockpit system including:
    a front display disposed in front of a driver's seat and a passenger seat of the vehicle, the front display including display areas and a shy button included in at least one of the display areas;
    a camera configured to monitor the driver's seat or the passenger seat; and
    a controller configured to:
      determine whether an occupant is in the driver's seat or the passenger seat;
      control at least one of the display areas of the front display;
      activate the shy button, only when the occupant is detected in the passenger seat through the camera;
      deactivate the shy button when the occupant is not detected in the passenger seat and make the display area including the shy button indistinguishable from the other display areas of the front display; and
      deactivate the shy button in response to detection by the camera of a user approaching the shy button.

10. The vehicle of claim 9, wherein the shy button includes at least one touch-sensitive button, and
  wherein the shy button includes an engraved outer surface.

11. The vehicle of claim 9,
  wherein the front display further includes a first in-vehicle infotainment (IVI) display and a second IVI display, and
  wherein the shy button includes:
    a first button to adjust a screen brightness of the second IVI display; and
    a second button to adjust a volume of multimedia played on the second IVI display.

12. The vehicle of claim 9, wherein the controller is further configured to automatically deactivate the shy button in response to a detection of a video being played on the front display.

13. The vehicle of claim 9, further comprising:

an approach detection sensor, wherein the controller is further configured to deactivate the shy button in response to detection by the approach detection sensor of a user approaching the shy button.

14. The vehicle of claim 9, further comprising:

a see-through panel configured to, when a low mode is applied, provide information to the driver and the passenger by transmitting light from a lower area of the front display, after the front display is moved downward, wherein the front display is moved downward in response to the low mode being applied, and wherein a button located in a lower part of the shy button is covered by the see-through panel in response to the low mode being applied.

15. The vehicle of claim 14, wherein in the low mode, at least one of exposed buttons in the shy button is configured to further implement a function of the button located in the lower part.

16. The cockpit system of claim 14, wherein the see-through panel is configured to implement a function of the button located in the lower part in response to a shy button area being touched.

\* \* \* \* \*